(12) United States Patent
Hebborn et al.

(10) Patent No.: US 9,578,728 B2
(45) Date of Patent: Feb. 21, 2017

(54) LONG LIFE, FAIL SAFE TRAFFIC LIGHT

(71) Applicant: Dialight Corporation, Farmingdale, NJ (US)

(72) Inventors: Kevin A. Hebborn, Toms River, NJ (US); Glenn J. Zingler, Lakewood, NJ (US)

(73) Assignee: Dialight Corporation, Farmingdale, NJ (US)

( * ) Notice: Subject to any disclaimer, the term of this patent is extended or adjusted under 35 U.S.C. 154(b) by 286 days.

(21) Appl. No.: 13/920,806

(22) Filed: Jun. 18, 2013

(65) Prior Publication Data

US 2014/0368111 A1 Dec. 18, 2014

(51) Int. Cl.
H05B 37/02 (2006.01)
H05B 41/292 (2006.01)
H05B 33/08 (2006.01)
G08G 1/095 (2006.01)
G01R 31/02 (2006.01)

(52) U.S. Cl.
CPC ...... *H05B 41/2925* (2013.01); *H05B 33/0881* (2013.01); *H05B 33/0893* (2013.01); *G01R 31/025* (2013.01); *G08G 1/095* (2013.01); *H05B 33/089* (2013.01); *H05B 33/0815* (2013.01); *H05B 33/0824* (2013.01); *H05B 33/0851* (2013.01); *H05B 33/0884* (2013.01); *H05B 33/0896* (2013.01); *H05B 41/2921* (2013.01); *H05B 41/2923* (2013.01); *H05B 41/2926* (2013.01)

(58) Field of Classification Search
CPC . G01R 31/025; H05B 37/038; H05B 33/0887; H05B 33/0881; H05B 33/0815; H05B 33/0851; H05B 33/0806; H05B 33/0824; H05B 33/0827; H05B 33/0842; H05B 33/0845; H05B 33/0884; H05B 33/089; H05B 33/0893; H05B 33/0896; H05B 41/2921; H05B 41/2923; H05B 41/2925; H05B 41/2926
USPC ............... 315/122, 307, 130, 193, 291, 294
See application file for complete search history.

(56) References Cited

U.S. PATENT DOCUMENTS

| | | | | |
|---|---|---|---|---|
| 4,414,601 A * | 11/1983 | Conroy, Jr. | ............ | H02H 3/044 361/94 |
| 5,099,177 A * | 3/1992 | Taniguchi | ............ | H05B 37/038 315/130 |
| 5,168,198 A * | 12/1992 | Watanabe | ............ | H05B 37/038 315/130 |
| 5,246,439 A * | 9/1993 | Hebborn | ................ | A61B 18/16 128/908 |
| 5,475,371 A * | 12/1995 | Dunk | ..................... | H02H 3/044 324/522 |
| 5,480,399 A * | 1/1996 | Hebborn | ................ | A61B 18/16 128/908 |

(Continued)

OTHER PUBLICATIONS

Supertex inc. 'HV9931 Unity Power Factor LED Lamp Driver' 2008.*

*Primary Examiner* — Thai Pham
*Assistant Examiner* — Borna Alaeddini

(57) ABSTRACT

The present disclosure is directed to a method for detecting a failure in a signal light. In one embodiment, the method includes monitoring operation of one or more light emitting diodes (LEDs) of the signal light coupled to a constant current driver, detecting a short circuit in at least one of the one or more LEDs and signaling a failure in the signal light when the short circuit is detected.

8 Claims, 7 Drawing Sheets

(56) References Cited

U.S. PATENT DOCUMENTS

| | | | | |
|---|---|---|---|---|
| 6,153,985 | A * | 11/2000 | Grossman | H05B 33/0851 315/149 |
| 7,731,384 | B2 * | 6/2010 | Curran | F21V 23/04 315/194 |
| 7,777,424 | B2 * | 8/2010 | Hebborn | H05B 33/0815 315/185 S |
| 9,414,451 | B2 * | 8/2016 | Seki | H05B 33/0818 |
| 2003/0234621 | A1 * | 12/2003 | Kriparos | H05B 33/0854 315/224 |
| 2004/0201496 | A1 | 10/2004 | Hering et al. | |
| 2007/0013322 | A1 * | 1/2007 | Tripathi | H05B 33/0815 315/291 |
| 2007/0024254 | A1 * | 2/2007 | Radecker | H02M 7/537 323/247 |
| 2007/0182347 | A1 * | 8/2007 | Shteynberg | H05B 33/0815 315/312 |
| 2008/0031520 | A1 | 2/2008 | Hou | |
| 2008/0042597 | A1 * | 2/2008 | Hebborn | H05B 33/0815 315/291 |
| 2009/0051506 | A1 * | 2/2009 | Hicksted | B60Q 1/2611 340/332 |
| 2009/0153059 | A1 * | 6/2009 | Kitagawa | H05B 33/0881 315/77 |
| 2010/0039794 | A1 * | 2/2010 | Ghanem | G08G 1/095 362/20 |
| 2010/0156324 | A1 * | 6/2010 | Nagase | H05B 33/089 315/307 |
| 2010/0264828 | A1 * | 10/2010 | Cortigiani | H05B 33/0887 315/130 |
| 2011/0062872 | A1 * | 3/2011 | Jin | H05B 33/0818 315/122 |
| 2011/0193542 | A1 * | 8/2011 | Kwok | H02M 1/32 323/284 |
| 2011/0260619 | A1 * | 10/2011 | Sadwick | H05B 33/0815 315/85 |
| 2012/0080944 | A1 * | 4/2012 | Recker | H02J 9/02 307/25 |
| 2012/0299500 | A1 * | 11/2012 | Sadwick | H05B 33/0887 315/224 |
| 2013/0020946 | A1 * | 1/2013 | Boezen | H05B 33/0887 315/127 |
| 2013/0039044 | A1 | 2/2013 | Burton et al. | |
| 2014/0265935 | A1 * | 9/2014 | Sadwick | H05B 33/0815 315/307 |
| 2014/0327359 | A1 * | 11/2014 | Masazumi | H01L 27/3204 315/122 |

* cited by examiner

LONG LIFE, FAIL SAFE TRAFFIC LIGHT

BACKGROUND

The life span of currently used traffic lights is limited by the life span of a driver or power supply of the traffic light powering the lights. For example, electrolytic capacitors are often used in drivers for lights as they offer large capacitance values in small sizes. However, they can limit the life of the driver due to drying of their electrolyte over several years.

Simply changing the electrolytic capacitor for another type of capacitor may not always be practical as other types of capacitors are much larger and/or more expensive for the same capacitance and voltage ratings. In addition, simply replacing electrolytic capacitors in an existing design with other types of lower capacitance can cause problems, such as for example, high output current ripple, stability and flicker.

Many traffic light systems rely on being able to detect a minimum current draw from a light to confirm operation of the light. Older filament bulbs and older light emitting diode (LED) technologies drew an easily measureable minimum current. But due to rapid advancement in lighting technologies, traffic lights have increased efficiency to the point where the current draw is sometimes below that is required by the traffic light controllers.

SUMMARY

In one embodiment, the present disclosure provides a method for detecting a failure in a signal light. In one embodiment, the method comprises monitoring operation of one or more light emitting diodes (LEDs) of the signal light coupled to a constant current driver, detecting a short circuit in at least one of the one or more LEDs and signaling the failure in the signal light when the short circuit is detected.

In one embodiment, the present disclosure provides a light signal circuit. In one embodiment, the light signal circuit comprises an AC to direct current (AC-DC) converter coupled to the AC power supply, a controller in communication with the AC-DC converter, one or more LEDs coupled to the AC-DC converter, an under current and under voltage sensing circuit coupled to the one or more LEDs and a failed state impedance circuit coupled to the under current and under voltage sensing circuit and the control circuit.

In one embodiment, the present disclosure provides an alternating current to direct current (AC-DC) converter for driving one or more light emitting diodes (LEDs) of a signal light. In one embodiment, the AC-DC comprises a first diode, a first inductor coupled to the first diode, a first capacitor coupled to the first inductor, wherein the first capacitor comprises a non-electrolytic capacitor, a second diode coupled to the first capacitor and the first diode, wherein the first diode, the first inductor, the first capacitor and the second diode comprise a first loop and a switch coupled to the first loop.

BRIEF DESCRIPTION OF THE DRAWINGS

So that the manner in which the above recited features of the present disclosure can be understood in detail, a more particular description of the disclosure, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

As discussed above, the life span of currently used traffic lights is limited by the life span of a driver or power supply of the traffic light powering the lights. For example, electrolytic capacitors are often used in drivers for lights as they offer large capacitance values in small sizes. However, they can limit the life of the driver due to drying of their electrolyte over several years.

Simply changing the electrolytic capacitor for another type of capacitor may not always be practical as other types of capacitors are much larger and/or more expensive for the same capacitance and voltage ratings. In addition, simply replacing electrolytic capacitors in an existing design with other types of lower capacitance can cause problems, such as for example, high output current ripple, stability and flicker.

In addition, many signal lights can detect when there is an under-current due to an open circuit. However, current signal light designs cannot detect when a short circuit has occurred at one or more of the light sources of the signal light.

For example, LEDs that were traditionally used in traffic signal lights were always thought to fail as an open circuit, thus, monitoring for a failure in light output was always accomplished by monitoring the current flow to the one or more LEDs on the traffic signal light to detect for an open circuit. However, it has been identified that current high power LEDs that are now being used for traffic signal applications can also fail to have light output as a result for a short circuit. Thus, one embodiment of the present disclosure provides a method and apparatus to monitor for a loss of light output from the LEDs as a result of one or more of the LEDs failing as a short circuit.

Figure 1:
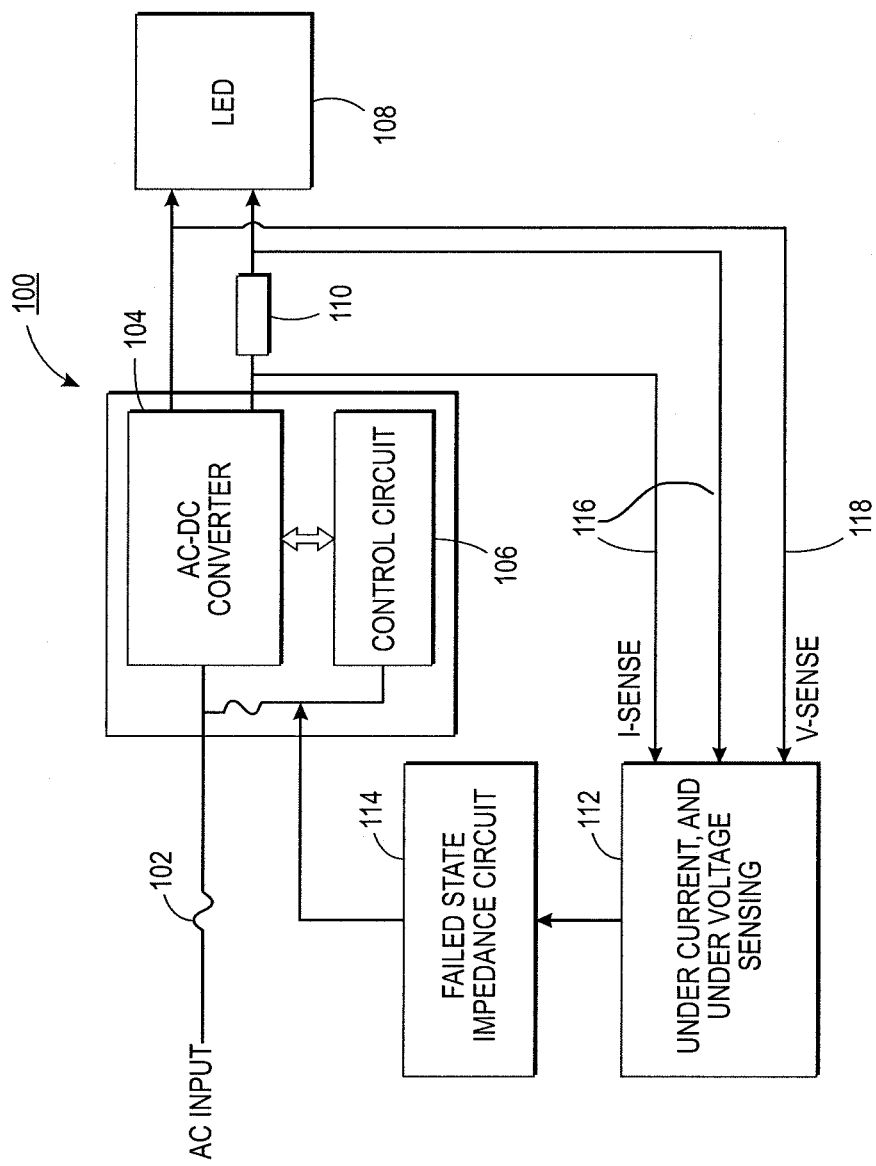
FIG. 1 depicts a block diagram of one embodiment of an example circuit diagram of a traffic light.

FIG. 1 illustrates a high level block diagram of one embodiment of a circuit 100 for a traffic signal light that provides a long life fail safe driver for one or more LEDs of a signal light and provides under voltage detection when a short circuit has occurred at the one or more LEDs. In one embodiment, the circuit 100 includes an alternating current (AC) power source. The AC power source may be fed through a fuse 102 and an alternating current to direct current (AC-DC) converter 104.

In one embodiment, a control circuit 106 may be in communication with the AC-DC converter 104. In one embodiment, the control circuit 106 may include a processor, a non-transitory or physically tangible computer readable memory (e.g., a hard drive storage, a solid state drive storage, a random access memory (RAM), a read only memory (ROM), and the like), a control module for executing the functions or methods described herein and one or more input/output devices.

In one embodiment, the AC-DC converter 104 may provide a constant or controlled DC power source to one or more LEDs 108 of the signal light. In one embodiment, a sense resistor 110 may be coupled to the AC-DC converter 104 and the one or more LEDs 108. The sense resistor 110 may be used to measure a current of the one or more LEDs 108. In one embodiment, a voltage sense circuit may be used to measure a voltage of the one or more LEDs 108. Various embodiments of the voltage sense circuit are discussed below.

In one embodiment, an under-current and under-voltage sensing circuit 112 is provided. The under-current and under-voltage sensing circuit 112 may use the measured current and voltage values to determine whether a open circuit or a short circuit has occurred at the one or more LEDs 108. In one embodiment, the measured current and voltage values may be compared against a current threshold and a voltage threshold respectively, to determine if an open circuit or a short circuit has occurred.

In one embodiment, the under-current and under-voltage sensing circuit 112 may measure current via the current sense (I-sense) lines 116 and may measure the voltage via the voltage sense (V-sense) line 118. In one embodiment, two lines are needed to sense the current. The two lines 116 are connected across the resistor 110. In one embodiment, the voltage is measured between the V-sense line 118 and one of the two I-sense lines 116.

In one embodiment, a failed state impedance circuit 114 may be coupled to the under-current and under-voltage sensing circuit 112. For example, if either an open circuit or a short circuit is detected by the circuit 112, the failed state impedance circuit 114 may be triggered to blow the fuse 102 and cause the circuit 100 to enter into a high impedance state.

Although the under-current and under-voltage sensing circuit 112 is illustrated as being part of the circuit 100 for the signal light, it should be noted that the under current and under voltage sensing circuit 112 may be located anywhere. For example, the circuit 112 may be implemented as part of the circuit board of each one of the one or more LEDs 108 or may be implemented as an external circuit in communication with a signal light circuit that does not have under-current or under-voltage detection capabilities.

Figure 2:
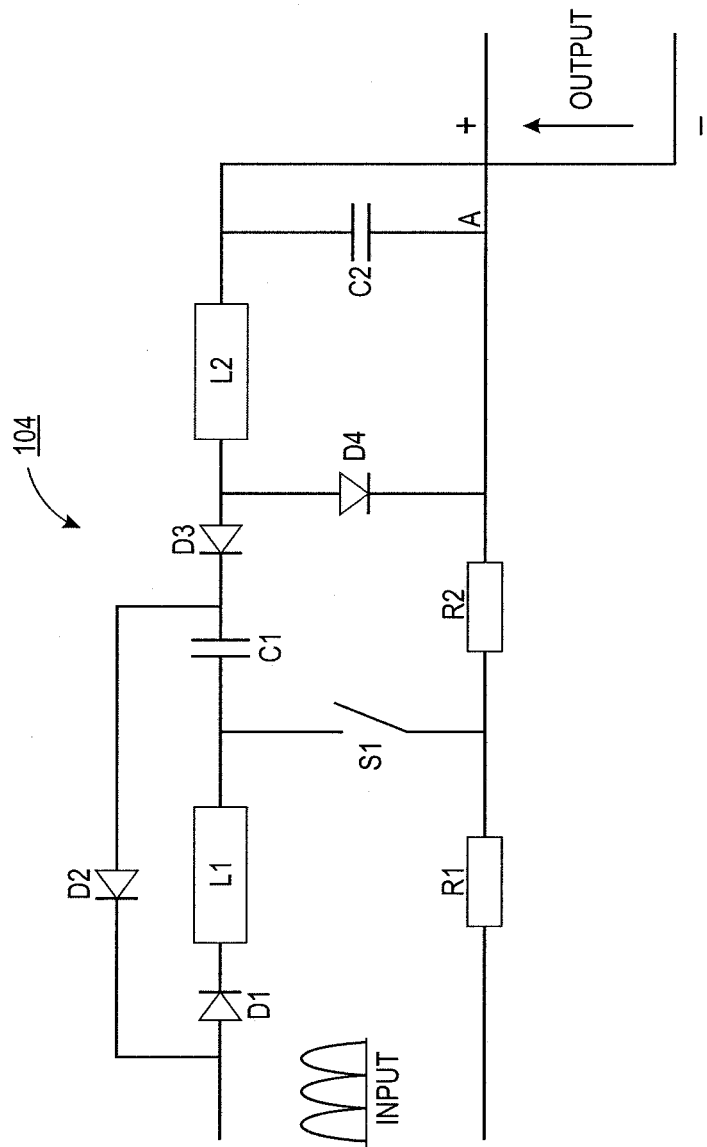
FIG. 2 depicts a more detailed diagram of one embodiment of an example AC-DC converter topology.

FIG. 2 illustrates a more detailed diagram of one embodiment of the AC-DC converter 104. As discussed above, the AC-DC converter 104 is coupled to the AC power source. The input is full wave rectified DC derived from a bridge rectifier and AC source.

In one embodiment, electrolytic capacitors are replaced with a non-electrolytic capacitor or low value capacitor, for example, a small metal film capacitor. For example, in previous designs the capacitor C1 is an electrolytic capacitor. However, in the present design, the capacitor C1 comprises a non-electrolytic capacitor or a small value capacitor such as a small metal film capacitor. In one embodiment, the AC-DC converter 104 uses a non-electrolytic or small value capacitor while still providing power factor correction and low output current ripple. In addition, the small internal capacitance gives the advantage of fast turn-on and turn-off times required by some traffic light standards over previous driver or converter designs that use a large electrolytic capacitor with high capacitance.

It should be noted that the present circuit design does not simply replace electrolytic capacitors for non-electrolytic capacitors in an AC-DC converter topology that requires high capacitance values. Such replacement would require a large and expensive amount of non-electrolytic capacitors (e.g., small metal film capacitors or ceramic capacitors). Rather, the present disclosure recognizes that the topology of LED traffic signal lights requires a small value of capacitance to do the job and, thus, replaces the need for electrolytic capacitors with non-electrolytic capacitors.

In one embodiment, the AC-DC converter 104 operates as follows. The switch S1 closes allowing current to ramp up linearly in the inductor L1, until either current in the inductor L1 reaches a first current threshold or the current in the resistor R2 reaches a second current threshold. The inductor L1 now has stored energy. In one embodiment, the switch S1 may comprise a semiconductor switching device or transistor, such as for example, a Bipolar transistor or a metal oxide semiconductor field effect transistor (MOSFET).

When the switch S1 opens, the stored energy in the inductor L1 is passed to the capacitor C1. The capacitor C1 becomes charged by the inductor L1 passing current around a first loop formed by the inductor L1, the capacitor C1, a diode D2 and a diode D1.

After a fixed off-time, the switch S1 closes so switching the capacitor C1 across the input to a buck stage formed by a diode D3, a diode D4, an inductor L2 and a capacitor C2. Current ramps up in the inductor L2 until the second current threshold is reached at which time the switch S1 is switched on again. The output of the buck stage is negative with respect to point A in FIG. 2.

Figure 3:
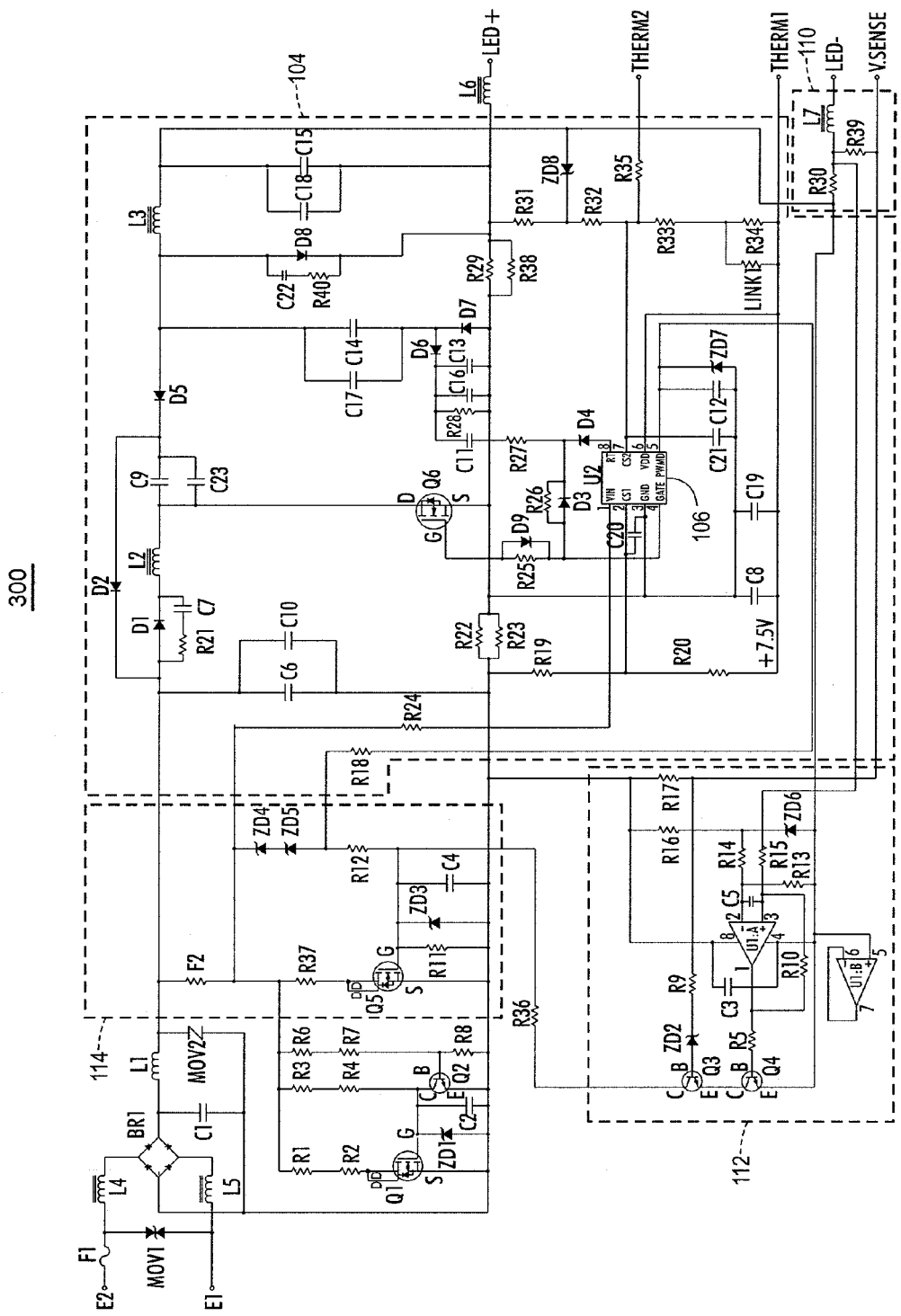
FIG. 3 depicts a circuit diagram of one embodiment of the traffic light.

FIG. 3 illustrates a detailed diagram of a circuit 300 of a signal light. The circuit 300 is similar to the circuit 100 and similar portions are highlighted by dashed lines and numbered similarly to the circuit 100. For example, FIG. 3 illustrates highlighted boxes that represent the AC-DC converter 104, the control circuit 106, the sense resistors 110, the under current and under voltage sensing circuit 112 and the failed state impedance circuit 114. In one embodiment, the diodes D1, D2, D5, D8, the transistor Q6 and the inductors L2 and L3 may form the basic elements of the AC-DC power converter 104.

In one embodiment, the circuit 300 may be designed to provide programmable LED current to allow the circuit 300 to be used with a wide variety of LED types with different current requirements. In one embodiment, the output current may be set by means of a resistor or thermistor mounted on the light engine and connected to terminals THERM1 and THERM2. This allows a threshold at pin 7 of the controller U2 to be adjusted and, thereby, set the output current.

In one embodiment, the THERM1 and THERM2 terminals also provide compensation for the effect of varying temperature of the LEDs 108. For example, as temperature increases, light output of an LED decreases. So in order to maintain constant light output the drive current must be increased with temperature. At low operating temperatures light output increases. So it is not necessary to drive the LEDs at a high current.

In one embodiment, the circuit 300 provides under voltage lockout. For example, the control circuits cannot operate until the supply voltage is sufficient to allow zener diodes ZD4 and ZD5 to conduct. Only when the zener diodes ZD4 and ZD5 conduct is the control circuit U2 enabled.

In one embodiment, the circuit 300 provides a failed state impedance as noted above. In one embodiment, the control circuits are powered through the fuse F2. Under normal conditions the transistor Q5 is held off by the transistors Q3 and Q4 being on so pulling Q5's gate negative. In the event of low output current or voltage, either the transistor Q3, the transistor Q4 or both turn off causing the transistor Q5 to turn on and blow the fuse F2 to create a high impedance state.

In one embodiment, the control circuit U1:A provides low output current detection using a programmable resistor that sets a low current threshold. For example, the output current may be sensed by means of the voltage across resistor R30 which is compared to a reference across a programmable resistor R13. If the output current is too low the control circuit U1:A pin 1 goes low, so turning the transistor Q4 off to turn on the transistor Q5 which blows the fuse F2.

In one embodiment, the transistor Q3 and the zener diode ZD2 provide low output voltage detection. In the event of low output voltage, the zener diode ZD2 no longer conducts so the transistor Q3 cannot remain on. As a result, the transistor Q5 is turned on which blows the fuse F2.

In one embodiment, the circuit 300 also provides conflict monitoring. For example, when the transistor Q2 is supplied with normal operating voltages, the transistor Q2 remains on so keeping the transistor Q1 turned off. But when the controller turns the light off through a high impedance, the transistor Q2 is turned off allowing the transistor Q1 to come on, thereby, pulling down the terminal voltage so as to meet conflict monitor requirements of some engineering standards.

Table 1 is provided below that provides an example parts list for the components of the circuit 300 illustrated in FIG. 3. It should be noted that Table 1 is only an example list and that the values and components may vary depending on a particular application.

TABLE 1

Parts List for circuit 300

| Part | Description/Value |
|---|---|
| C11 | CAP., .01 UF 50 V, CHIP, 0805 |
| C2,3 | CAPACITOR, .1 UF 50 V, CHIP, 0805 |
| C24 | CAP 22 PF 50 V CERMCHIP 0805 SMD |
| C8,19 | CAP 10 UF 25 V CERAMIC X5R 1210 |
| C1,C6 | 0.1 uF/450 V, 5%, met poly, 15 mm |
| C7 | CAPACITOR, 220 PF, 200 V CER 0805 |
| C5 | CAPACITOR, 470 PF 50 V CER 0805 |
| C10,23 | CAPACITOR, 4700 PF 630 V CER 1206 |
| C21 | CAP.100 PF 50 V CERM 0805 SMD |
| C18 | CAP CER 4.7 UF 50 V 10% X7R 1210 |
| C22 | CAP, CER, 100 PF/630 V, X7R, 0805 |
| C4 | CAP, 4.7 UF, 10 V, 10%, X7R, 1206 |
| C12 | CAP, 0.22 UF 50 V X7R 0805 |
| C16,17 | 1 nF/1 kV, 10%, 5 mm cer radial |
| C9 | 4.7 uF/250 VDC/10%, 22.5 mm, film |
| MOV1 | SURGE ABSORBER, 240 V 6500 A |
| D3,4,9 | DIODE, SWITCH, 200 MW 75 V |
| ZD8 | DIODE, ZENER 500 MW 27 V SOD 123 |
| BR1 | BRIDGE RECT, GPP 1000 V 1.5 A |
| ZD1 | DIODE, ZENER, 500 MW 16 V |
| ZD3 | DIODE, 15 V/500 MW |
| ZD2,6,7 | DIODE ZENER 500 MW 5.1 V SOD123 |
| ZD4,5 | DIODE, ZENER 500 MW 33 V SOD 123 |
| D1,2,5,8 | ES3J, 3 A/600 V, SMC, SUPER FAST |
| D7,6 | US1K, 800 V/1 A, Ultra Fast, SMA |
| MOV2 | MOV, 175VAC, 1250 A, 7 mm |
| U1 | DUAL OP AMP 8-PIN SOP |
| U2 | HV9931, PFC Control IC, SOIC-8 |
| R30 | RES .22 OHM ¼ W 1%, 1206 |
| R12 | RESISTOR 200K OHM ¼ W 1%, 1206 |
| R3,4,6,7,18 | RESISTOR 47K OHM ¼ W 1%, 1206 |
| R37 | Res 274 ohm 0.6 W 1% metal film |
| R9 | RESISTOR, 47 OHM, ⅛ W, 1%, 0805 |
| R13 | Res, 56 ohm, ⅛ W, 1%, 0805 |
| R25,32 | RESISTOR, 100 OHM 1% ⅛ W 0805 |
| R31 | RES 1.0K OHM ⅛ W 1% 0805 COTS |

TABLE 1-continued

Parts List for circuit 300

| Part | Description/Value |
|---|---|
| R5,14,15,20,34,36 | RESISTOR 10.0K ⅛ W 1% 0805 |
| R35 | RESISTOR, 11K ⅛ W 1%, 0805 |
| R26 | RESISTOR, 150K, ⅛ W, 1%, 0805 |
| R27,28 | RESISTOR, 1.5 M, ⅛ W, 1%, 0805 |
| R33 | RESISTOR, 18K, ⅛ W, 1%, 0805 |
| R8 | RESISTOR, 2.2K, ⅛ W, 1%, 0805 |
| R19 | RESISTOR, 470 OHM, ⅛ W, 1%, 0805 |
| R22 | RES, 0.1 OHM ¼ W 1%, 1206 |
| R29 | RES 1.0 OHM ¼ W 1206 1% |
| R24 | RESISTOR, 10K OHM ¼ 1% 1206 |
| R16,17,40 | RESISTOR, 1.5K OHM, ¼ W 1% 1206 |
| R21 | RESISTOR, 2.7K, ¼ W, 1% 1206 |
| R1,2 | RESISTOR, 470 OHM ¼ W 1% 1206 |
| Q2-4 | TRANS, NPN 40 V 200 MA SOT-23 |
| Q6 | N-ch MOSFET, 600 V, 7 A, TO220 |
| Q5,7 | MOSFET STN1HNK60 600 V SOT223 |
| L1 | CHOKE 1.8 MH .65 A EF16/4.7 |
| L4-7 | FERRITE 600 OHM, 1 A SMD 1206 |
| L2 | 150 uH, 2 A rms, 2.1 A sat. 5 mm |
| L3 | 1 mH, 0.8 A rms, 0.8 A sat. 5 mm |
| F1 | FUSE, 4 A.T, 250 V, TR5 |
| F2 | Fuse 0.125 A/125 V. Fast, 1206 |

Figure 4:
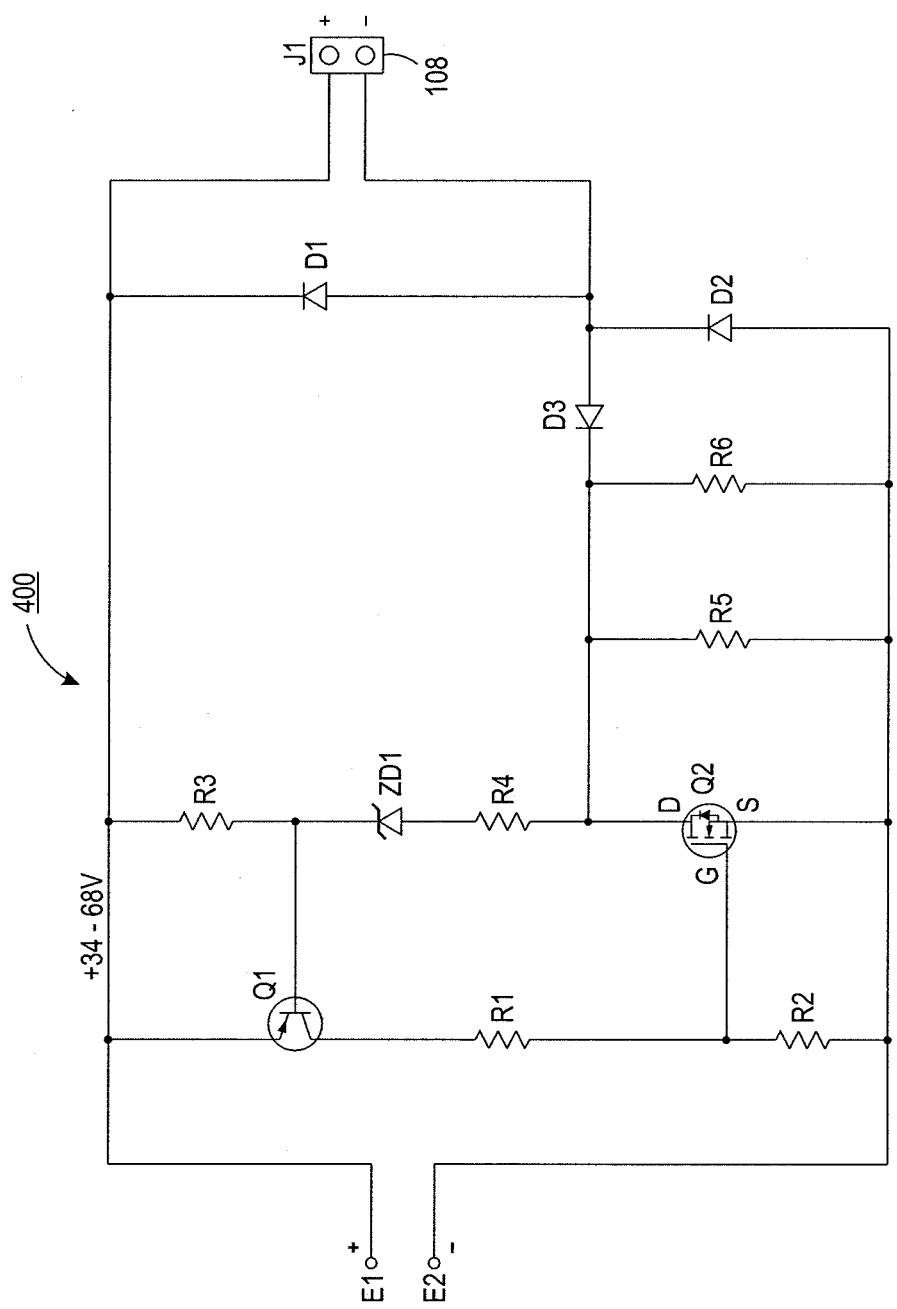
FIG. 4 depicts a circuit diagram of one embodiment of a low voltage detection circuit.

FIG. 4 illustrates a circuit 400 that may be added to a light engine to add low voltage detection to a driver that does not have low voltage detection capability. For example, as noted above, current designs only detect low current or an open circuit condition. Current designs may be retro-fitted with the circuit 400 to externally add a circuit for low voltage detection.

In one embodiment, the circuit 400 allows current to flow in the LEDs 108 while the total voltage exceeds a certain voltage threshold. However, when the voltage falls below the certain voltage threshold, the current is shut off. With no current flowing into the LEDs 108, the driver goes into a high impedance state so the short circuit or under voltage cause can be detected.

Figure 5:
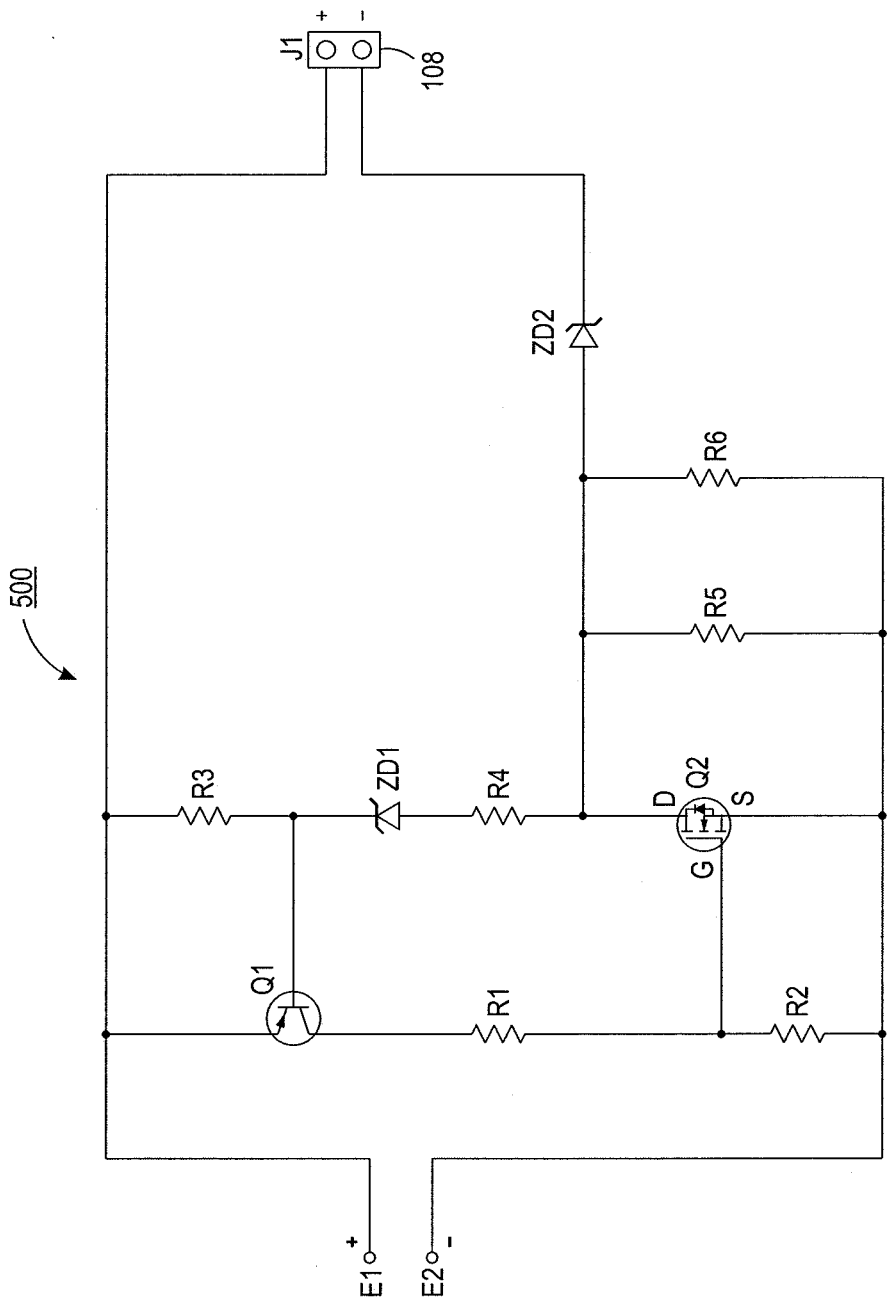
FIG. 5 depicts a circuit diagram of a second embodiment of a low voltage detection circuit.

FIG. 5 illustrates a second embodiment of a circuit 500 that may be added to a light engine to add low voltage detection to a driver that does not have low voltage detection capability and increases power dissipation. In one embodiment, the circuit 500 is similar to the circuit 400 except that the circuit 500 includes an extra zener diode ZD2. The increased power dissipation of the light engine increases current consumption of the light to allow a traffic controller to detect the presence of the light.

Figure 6:
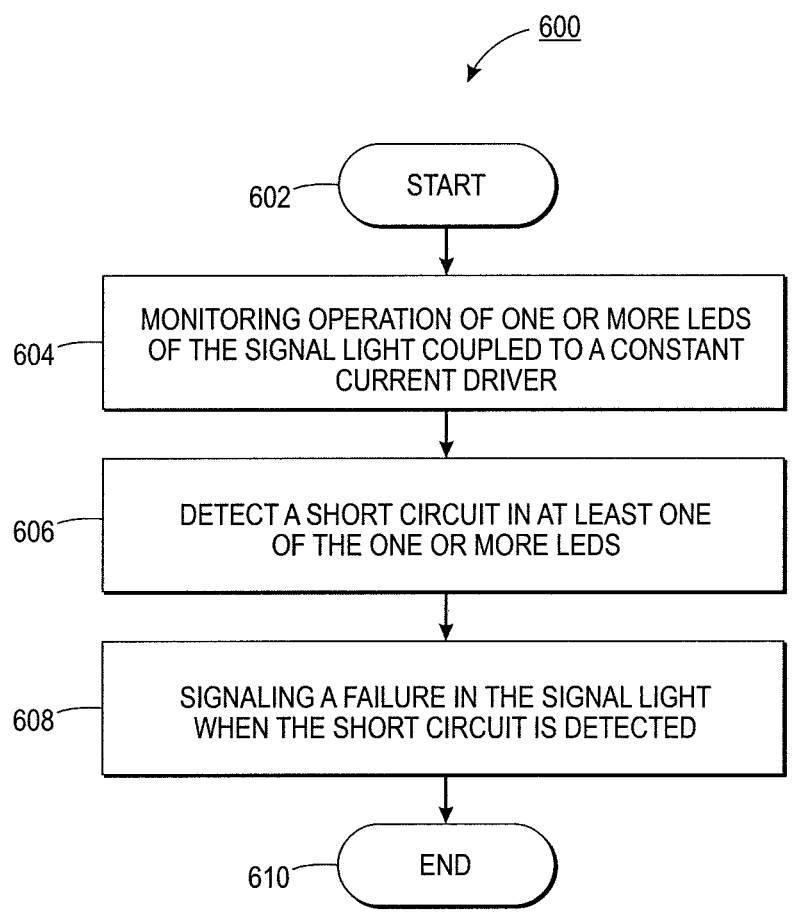
FIG. 6 depicts an example flow diagram of a method for detecting a failure in a signal light.

FIG. 6 illustrates an example flowchart of one embodiment of a method 600 for detecting a failure in a signal light. In one embodiment, the steps, functions, or operations of the method 600 may be performed by the circuit 100, 300, 400 or 500.

The method 600 begins at step 602. At step 604, the method 600 monitors operation of one or more light emitting diodes (LEDs) of the signal light coupled to a constant current driver. For example, the current and voltage passing over the one or more LEDs may be constantly measured.

At step 606, the method 600 detects a short circuit in at least one of the one or more LEDs. In one embodiment, the detecting may include setting a voltage threshold for the signal light, measuring a voltage across the one or more LEDs of the signal light, comparing the voltage to the voltage threshold and determining the short circuit has occurred when the voltage falls below the voltage threshold.

For example, as described above with reference to the circuits 100 and 300, a sense resistor may be used to sense and measure a voltage across the LEDs. A programming resistor may be used to set a low voltage threshold value. In one embodiment, a controller in the circuit may be used to perform the comparison of the measured voltage and the low voltage threshold value to determine if a short circuit is detected.

As noted above, current designs cannot detect a short circuit because even if a short circuit occurs in the LED, the constant current driver will provide a constant current. In other words, previous designs only monitor current and, thus, due to the constant current driver the current will not increase due to a short circuit. However, the present disclosure provides a novel low voltage detection circuit to detect a drop in the voltage of the LEDs due to a short circuit.

At step 608, the method 600 signals a failure in the signal light when the short circuit is detected. For example, a fuse in the circuit may be blown or current to the one or more LEDs may be turned off when the short circuit is detected to place the signal light in a high impedance state. The method 600 ends at step 610.

Figure 7:
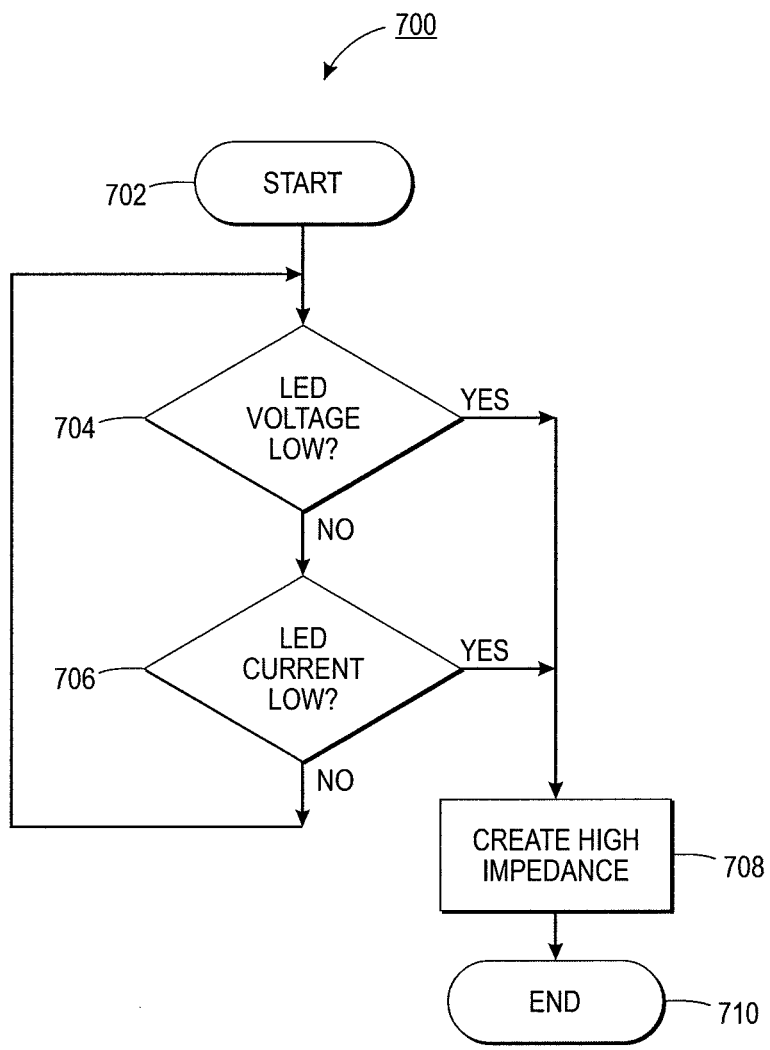
FIG. 7 depicts an example flow diagram of a second method for detecting a failure in a signal light.

FIG. 7 illustrates an example flowchart of one embodiment of a method 700 for detecting a failure in a signal light. In one embodiment, the steps, functions or operations of the method 700 may be performed by the circuit 100, 300, 400 or 500.

The method 700 begins at step 702. At step 704, the method 700 determines if a low voltage is detected for one or more of the LEDs. For example, any one of the low voltage detection methods or circuits described above may be used.

If a low voltage is detected at step 704, the method 700 may proceed to step 708. However, if a low voltage is not detected at step 704 the method 700 may proceed to step 706.

At step 706, the method 700 determines if a low current is detected for one or more of the LEDs. For example, any one of the low current detection methods or circuits described above may be used.

If a low current is not detected at step 706, the method 700 may loop back to step 704. However, if a low current is detected at step 706, the method 700 may proceed to step 708.

At step 708, the method 700 may create a high impedance state. For example, a fuse may be blown in the circuit as described above. The high impedance state may be maintained until a technician replaces the one or more LEDs that failed due to either a open circuit or short circuit. The high impedance state may be reset (e.g., the blown fuse may be reset). The method 700 ends at step 710.

It should be noted that although not explicitly specified, one or more steps or operations of the methods 600 and 700 described above may include a storing, displaying and/or outputting step as required for a particular application. In other words, any data, records, fields, and/or intermediate results discussed in the methods can be stored, displayed, and/or outputted to another device as required for a particular application. Furthermore, steps, operations or blocks in FIGS. 6 and 7 that recite a determining operation, or involve a decision, do not necessarily require that both branches of the determining operation be practiced. In other words, one of the branches of the determining operation can be deemed as an optional step. Furthermore, operations, steps or blocks of the above described methods can be combined, separated, and/or performed in a different order from that described above, without departing from the example embodiments of the present disclosure.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for detecting a failure in a signal light, comprising:
   monitoring operation of one or more light emitting diodes (LEDs) of the signal light coupled to a constant current driver;
   detecting a short circuit in at least one of the one or more LEDs, wherein the detecting the short circuit comprises:
      setting a voltage threshold for the signal light via a zener diode;
      measuring a voltage across the one or more LEDs of the signal light; and
      determining the short circuit has occurred when the voltage falls below the voltage threshold of the zener diode causing the zener diode to stop conducting, which causes a first transistor in communication with the zener diode to turn off; and
   signaling the failure in the signal light when the short circuit is detected, wherein the signaling comprises placing the signal light in a high impedance state by blowing a fuse in response to the voltage falling below the voltage threshold, wherein the fuse is blown by a second transistor in communication with the first transistor that turns on in response to the first transistor turning off.

2. The method of claim 1, wherein the detecting is performed by a controller.

3. The method of claim 1, wherein the detecting is performed by an under-current and under-voltage sensing circuit on a circuit board of one of the one or more LEDs.

4. The method of claim 1, wherein the detecting is performed by an under-current and under-voltage sensing circuit that is external to a circuit of the signal light.

5. A light signal circuit comprising:
   an alternating current (AC) to direct current (AC-DC) converter for coupling to an AC power supply;
   a control circuit in communication with the AC-DC converter;
   one or more LEDs coupled to the AC-DC converter;
   an under-current and under-voltage sensing circuit coupled to the one or more LEDs, wherein the under-current and under-voltage sensing circuit comprises:
      a zener diode having a voltage threshold that causes the zener diode to stop conducting;
      a first transistor in communication with the zener diode, wherein the first transistor turns off when the zener diode stops conducting in response to a measured voltage falling below the voltage threshold of the zener diode; and
      a second transistor in communication with the first transistor that turns on in response to the first transistor turning off; and
   a failed state impedance circuit coupled to the under-current and under-voltage sensing circuit and the control circuit, wherein the failed state impedance circuit goes into a high impendence state by blowing a fuse in the failed state impedance circuit when the second transistor turns on.

6. The light signal circuit of claim 5, wherein the under-current and under-voltage sensing circuit comprises:
   a programming resistor to set a current threshold.

7. The light signal circuit of claim 5, wherein the AC-DC converter comprises at least one non-electrolytic capacitor.

8. The light signal circuit of claim 5, further comprising:
   one or more terminals for connecting to a thermistor or a resistor mounted on each one of the one or more LEDs to set an output current that is compatible with the one or more LEDs.

* * * * *